(12) United States Patent
Pilat

(10) Patent No.: US 6,708,868 B1
(45) Date of Patent: Mar. 23, 2004

(54) METHOD FOR PRODUCING WELD POINTS ON A SUBSTRATE AND GUIDE FOR IMPLEMENTING SAID METHOD

(75) Inventor: Eric Pilat, Brison St Innocent (FR)

(73) Assignee: Applied Utech, Le Bourget du Lac (FR)

( * ) Notice: Subject to any disclaimer, the term of this patent is extended or adjusted under 35 U.S.C. 154(b) by 0 days.

(21) Appl. No.: 09/926,402

(22) PCT Filed: Apr. 26, 2000

(86) PCT No.: PCT/FR00/01097

§ 371 (c)(1),
(2), (4) Date: Oct. 26, 2001

(87) PCT Pub. No.: WO00/66312

PCT Pub. Date: Nov. 9, 2000

(30) Foreign Application Priority Data

Apr. 30, 1999 (FR) .............................. 99 05544

(51) Int. Cl.$^7$ ........................ B23K 31/02; B23K 35/12; B23K 1/08
(52) U.S. Cl. ............................ 228/180.22; 228/180.21; 228/254; 228/33; 228/39; 228/256
(58) Field of Search ................ 228/256, 254, 228/180.21, 180.22, 33, 39

(56) References Cited

U.S. PATENT DOCUMENTS

| | | | |
|---|---|---|---|
| 4,720,402 A | | 1/1988 | Wojcik |
| 5,244,143 A | * | 9/1993 | Ference et al. ........ 228/180.21 |
| 5,565,033 A | * | 10/1996 | Gaynes et al. .............. 118/210 |
| 5,673,846 A | * | 10/1997 | Gruber .................. 228/180.22 |
| 5,718,367 A | * | 2/1998 | Covell et al. ................ 228/254 |
| 5,735,452 A | * | 4/1998 | Yu et al. ...................... 228/254 |
| 5,743,457 A | * | 4/1998 | Benedette et al. ............ 228/33 |
| 6,003,757 A | * | 12/1999 | Beaumont et al. .......... 228/246 |
| 6,105,852 A | * | 8/2000 | Cordes et al. .............. 228/254 |
| 6,138,562 A | * | 10/2000 | Hertz et al. ................. 101/129 |
| 6,231,333 B1 | * | 5/2001 | Gruber et al. .............. 425/546 |
| 6,276,596 B1 | * | 8/2001 | Gruber et al. .............. 228/225 |
| 6,297,560 B1 | * | 10/2001 | Capote et al. .............. 257/778 |
| 6,386,436 B2 | * | 5/2002 | Hembree .................... 228/254 |

FOREIGN PATENT DOCUMENTS

| | | |
|---|---|---|
| EP | 0 902 610 | 3/1999 |
| WO | WO 97/36710 | 10/1997 |

\* cited by examiner

Primary Examiner—L. Edmondson
(74) Attorney, Agent, or Firm—Oblon, Spivak, McClelland, Maier & Neustadt, P.C.

(57) ABSTRACT

A method for molding and soldering electrical connection pads to the electrical connection-receiving zones of electronic components or circuits includes an operation for the injection of conductive liquid alloy into a guide open at one end placed so as to face the connection-receiving zone of the component. The guide is formed by two separable parts, a mold and an injection matrix, the mold and the injection matrix including passages, with a narrowing of the guide at the level of the separation of the parts, and the parts of the guide are separated while the alloy is in the liquid state. Such a method may find particular application to, as an example, making connection pads for substrates or electronic components.

28 Claims, 4 Drawing Sheets

METHOD FOR PRODUCING WELD POINTS ON A SUBSTRATE AND GUIDE FOR IMPLEMENTING SAID METHOD

The present invention relates to a method for the molding and soldering of electrical connection pads to the electric connection-receiving zones of circuits electronic circuits or components.

The electrical connections of electronic components such as integrated circuits comprising a large number of connection points are usually formed by solder balls soldered to metal connection-receiving zones of the substrate of the component. These connection-receiving zones are located on the face by which the component is attached to an electrical interconnection circuit.

A known method for making electrical connections of an integrated circuit comprises the following main steps: the manufacture of solder balls of the requisite diameter, the dipping of the balls in a flux and the deposition of the balls on the substrate of the component; the passage of the component equipped with balls through a furnace in order to carry out the soldering.

The balls are deposited on the substrate by a suction or screen type device depositing balls on the connection-receiving zones of the component.

These devices are costly and the making of the balls and their storage is very costly.

Another technique consists in making and soldering balls by means of the reflow of solder paste deposited by silk-screen process on the connection-receiving zones of the component. The solder paste is subjected to silk-screen process through two masks superimposed on the substrate. The top mask is used only to deposit the paste. The other mask serves as a mold and remains in position until the reflow of the solder paste in a through furnace. Owing to the presence of the flux, the substrates and the masks have to be cleaned.

Even if the solder paste is three to five times less costly than a prefabricated ball, the need to use these masks means that this technique too is a very costly one.

In order to overcome the drawbacks of the prior art, the invention proposes a method for making balls or solder connection pads on an electrically conductive connection-receiving zone of an electric component, the method comprising an injection of conductive liquid alloy into a guide open at one end placed so as to face the connection receiving zone of the component, wherein the guide is formed by two separable parts, a mold and an injection matrix, the mold and the injection matrix comprising passages, with a narrowing of the guide at the level of the separation of the parts, and the parts of the guide are separated while the alloy is liquid In the method for making solder connection pads according to the invention, as described hereinafter, the mold is the part in direct contact with the substrate of the component, and the injection matrix is the other part.

In a first variant of the method according to the invention, the mold is removed from the component before the solidification of the alloy. The molten metal present on the connection receiving zone of the component takes the shape of a ball when it cools down.

In another variant of the method, the mold is cooled below the liquidus point of the alloy so that the alloy gets solidified in the mold after the separation of the parts. The mold is separated from the component and, optionally, the alloy is remelted so that it takes the form of a ball.

The invention also relates to a guide for the making of balls or solder connection pads on electrically conductive connection-receiving zones of an electronic component, the guide being designed to contain a conductive liquid alloy and being open at one end, wherein it is formed by two separable parts comprising passages with a narrowing of the guide at the position of the separation of the parts.

In one embodiment of the guide, the two parts are separable in the direction of injection of the liquid alloy in the guide.

Other characteristics and advantages of the invention shall appear from the description of exemplary embodiments of the guide and of variants of the method according to the invention for molding and soldering the solder pads on a connection-receiving zone of the component. This description is made with reference to the appended drawings, of which:

Figure 1:
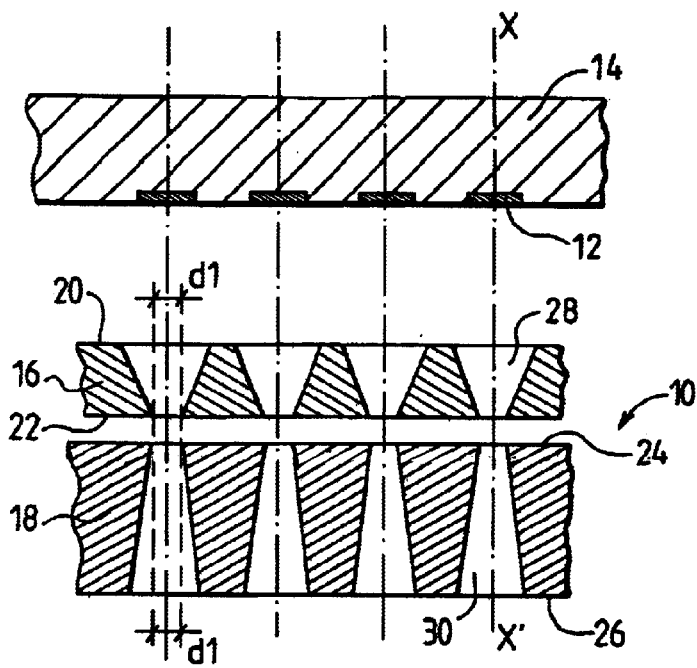
FIGS. 1, 2, 3, 4 and 5 show different embodiments and variants of these embodiments according to the invention.

FIG. 1 shows a guide 10 with several identical passages for the molding and soldering of electrical connection pads to connection-receiving zones 12 for the electrical connection of an integrated circuit 14.

The guide has a mold 16 and an injection matrix 18, each having two main parallel faces, one substrate face 20, one internal mold face 22 for the mold, and an internal face 24 and an external face 26 for the injection matrix.

The guide has, respectively, first passages 28 in the mold and second passages 30 in the ejection matrix, each of the first passages being aligned coaxially along an axis XX' with one of the respective second passages facing it. The axis XX' is substantially perpendicular to the main faces of the guide.

The distribution of the passages in the guide is the same as that of the metal connection-receiving zones 12 of the integrated circuit 14, so that each of the metal zones of the integrated circuit in contact with the substrate face 20 of the mold 16 faces a passage of the guide.

In a first embodiment of the guide, the first and second passages have a truncated cone shape, the small diameters of the truncated passages facing each other at the level of the separations of the two parts of the guide so that when these faces (22, 24) are in contact, the passage in the guide comprises a narrowing or a sudden flexure in the diameter of the guide at the level of the separation of the parts.

In a first variant of the first embodiment of the guide, shown in FIG. 1, the apertures with the smallest diameter of the first and second truncated passages respectively on the faces of the mold and the injection matrix in contact have substantially the same diameter d1.

Figure 2:
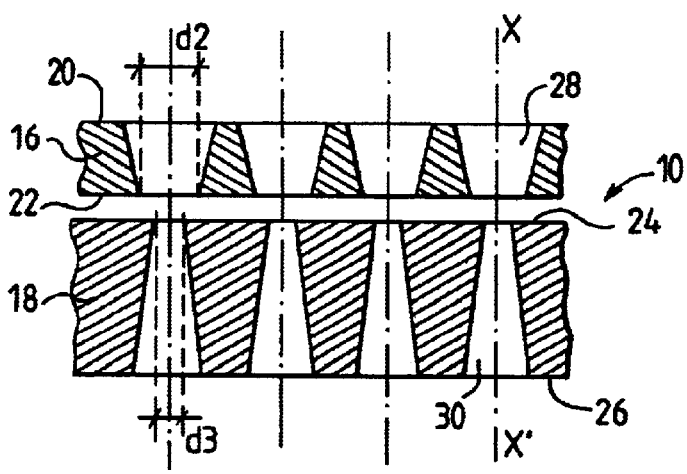

In a second variant of this first embodiment, (FIG. 2), the aperture of the first passage 28 of the mold facing the injection matrix has a diameter d2 greater than the diameter d3 of the aperture of the second passage 30 of the injection matrix facing the mold.

Figure 3:
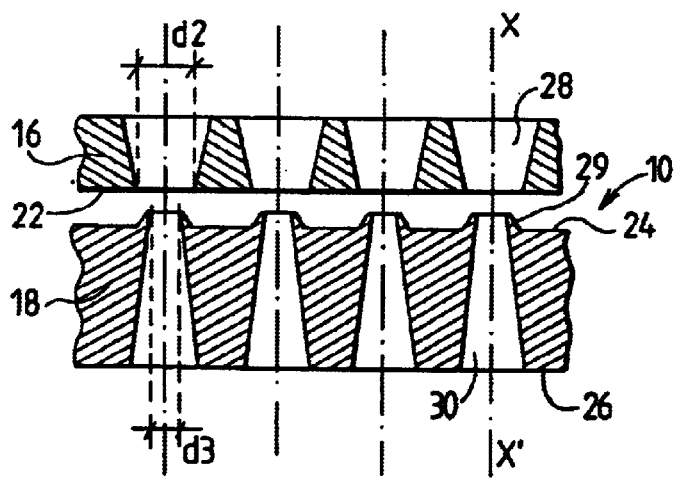

In a third variant of the first embodiment, (FIG. 3), the aperture of the first passage (28) of the mold facing the injection matrix has a diameter greater than the aperture of the second passage (30) of the injection matrix facing the mold. Furthermore, the aperture of the side of the internal face 24 of the second passage of the injection matrix 18 has a shoulder 29 which, when the mold and the injection matrix are in contact, penetrates into the first truncated passage 28 of the mold.

In this third variant, the shoulder 29 around the aperture of the injection matrix may be done by the machining of a part of the thickness of its internal surface 24 facing the mold, for example by means of a laser.

Figure 4:
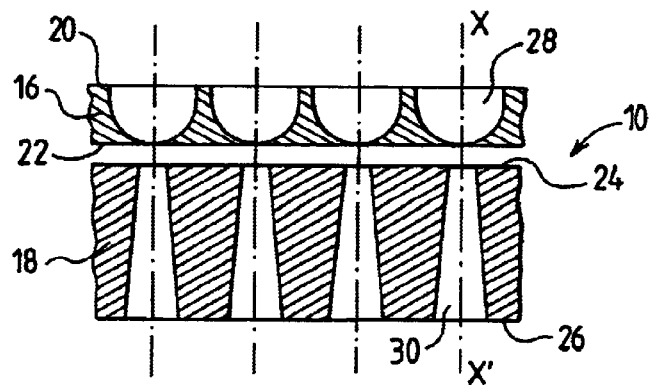

In a second embodiment of the guide (FIG. 4), the first passage 28 of the mold has an approximately semi-spherical shape, the biggest aperture being located on the substrate face 20 of the mold 16 and a small aperture being located on the internal face 22 of the mold. The second passage 30 has a truncated cone shape, and its smallest aperture is on the internal face 24 of the injection matrix 18 facing the small aperture of the first semi-spherical passage.

Figure 5:
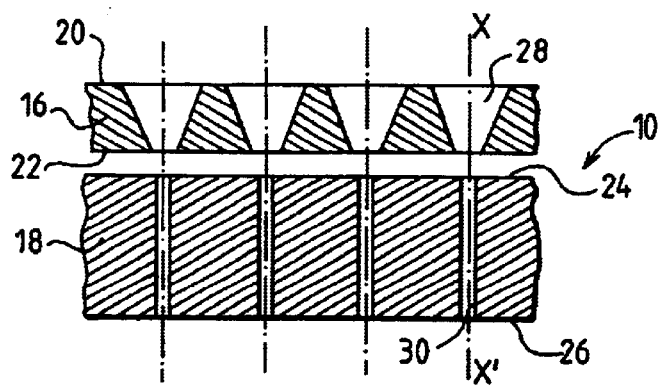

In a third embodiment of the guide (FIG. 5), the first passage 28 in the mold is truncated, the smallest diameter of the first passage facing the injection matrix and the second passage in said injection matrix having a cylindrical shape with a diameter that is very small as compared with the smallest diameter of the first passage 28 in the mold 16.

Figure 6:
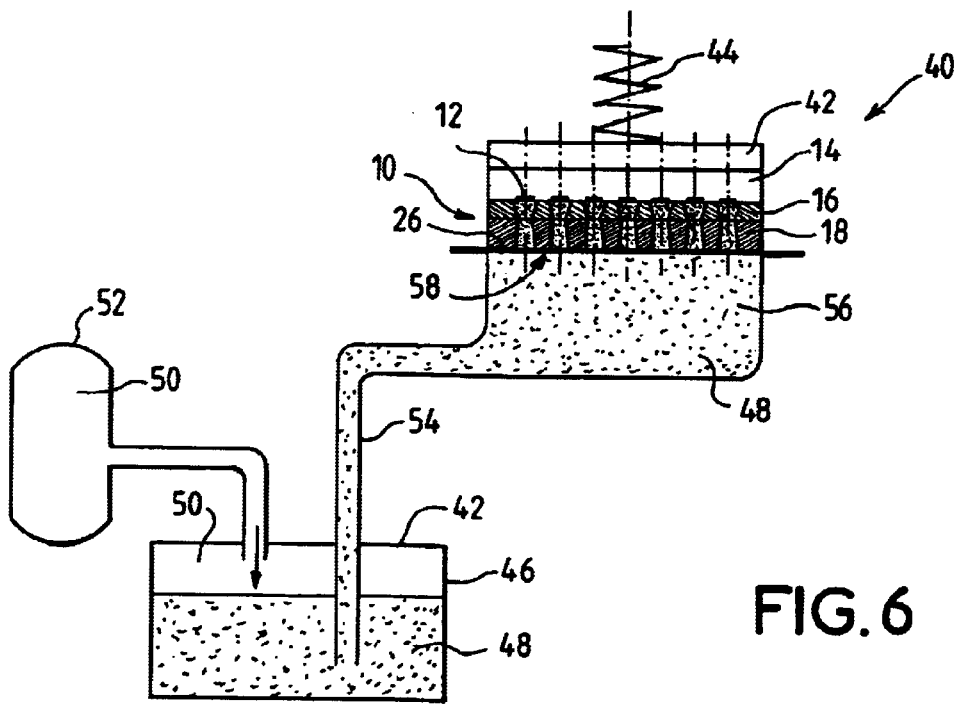
FIG. 6 shows a device for the implementation of the method for making solder pads according to the invention using the guide.
Figure 7:
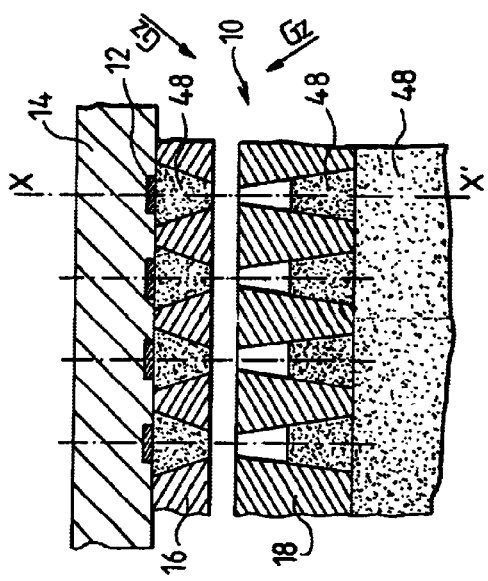
FIGS. 7, 8, 9 and 10 show different phases of a first variant of the method according to the invention for molding and soldering solder pads to a component.
Figure 8:
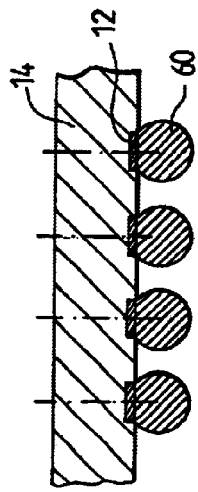
Figure 9:
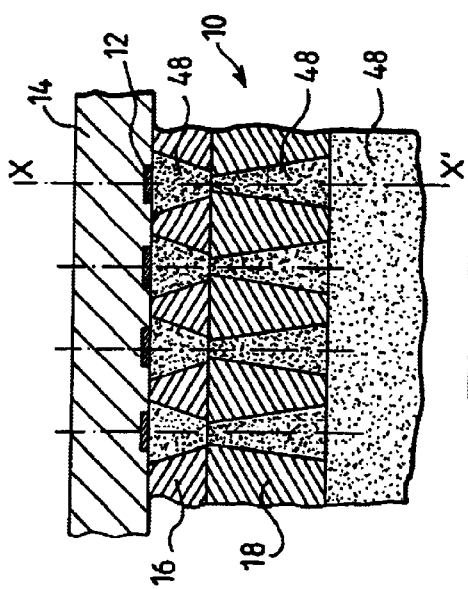
Figure 10:
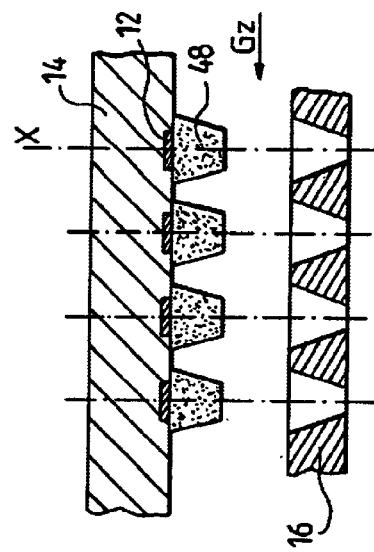

The method according to the invention for the making of solder connection pads on the substrate of a component is implemented by means of the guide in two separable parts. To this end, a device 40, represented by a schematic drawing in FIG. 6, produces the injection, into the passage of the guide 10, of the liquid alloy for the molding of the electrical connections on the component 14.

The component 14 has a part 42 placed against it. This part 42 is pushed by an elastic element 44 against the guide 10 so that the connection-receiving zones 12 of the component are facing the first passages 28 of the mold.

The device 40 essentially has a closed container 46 containing a molten alloy 48. The alloy may be put under pressure by a gas 50 coming from a container 52 containing the gas under pressure.

During a molding of the electrical connections to the component 14, the molten alloy 48 under pressure fills a cavity 56 through a conduit 54. This cavity 56 comprises an aperture 58 that includes all the passages of the guide 10. The component 14 is held by pressure on the guide, which itself is held flat against the aperture 58 of the cavity 56, closing this cavity. The face of the component 14 comprising the connection-receiving zones is placed flat against the substrate face of the mold and the external face 26 of the injection matrix is placed flat against the face of the cavity 56 comprising the aperture 58.

The molten alloy 48 in the cavity 56 is injected under pressure into the guide and, through the second passages of the injection matrix, it rapidly fills the first passages 28 of the mold and wets the connection-receiving zones 12 of the component 14.

It is assumed that the connection-receiving zones of the component are neither oxidized nor polluted by organic matter. They are wettable by the molten alloy. If note it is necessary first of all to carry out an additional cleaning step to prepare the substrates accordingly.

In the first variant, shown in FIGS. 7 to 10, of the method for molding and soldering electrical connection pads to the connection-receiving zones of the substrate of an integrated circuit package (component 14), the method comprises at least the following steps:

First step (FIG. 7); injection of the alloy: during the injection of the liquid alloy 48 under pressure into the passages of the guide, the mold 16 is held at a temperature below that of the injection matrix 18, but higher than the liquidus threshold of the alloy 48.

Second step (FIG. 8); separation of the mold from the injection matrix: the injection pressure drops or is even reversed, the liquid alloy 48 withdraws into the injection matrix 18. The liquid alloy filling the mold 16 remains because the mold is colder than the injection matrix and the connection-receiving zone 12 which has been wet by the alloy has a greater surface area than the hole of the mold on the injection matrix side. The tension that holds the liquid alloy back is therefore greater than the tension that tends to draw it into the injection matrix. Then the mold is separated from the injection matrix enabling a gas Gz that is an inert gas or even a reducing gas to protect the alloy, which is still in a liquid state, against oxidation. This same gas is also injected into the passages (or nozzles) of the injection matrix to keep it properly clean for the next cycle.

Third step (see FIG. 9); separation of the component (or substrate) from the mold: before the alloy solidifies, the component 14 is separated from the mold 16; despite the alignment defects, the alloy has wet a sufficient area of the connection-receiving zone 12 so that the liquid alloy 48 remains attached to the substrate of the component and not to the mold. The material of the mold (stainless steel 316L with chemical deburring, or graphite, or Teflon, or processed silicon for example) is chosen so as to minimize the surface tension between the alloy and the mold.

The liquid alloy 48 is always in a gaseous environment (Gz) comprising a neutral or even a reducing gas.

Fourth step (FIG. 10); solidification: Since the molten alloy no longer undergoes any mechanical stresses, it takes an almost spherical shape 60 for it is in this configuration that the surface tensions are reduced to the minimum. In cooling, the alloy gets permanently set in this shape.

Since there is no longer any need to use a flux, it is not necessary to clean the substrate of the component 14.

Figure 11:
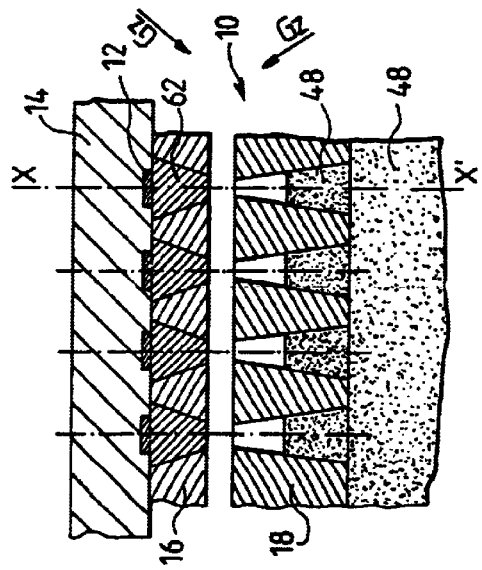
FIGS. 11, 12, 13 and 14 show different phases of a second variant of the molding and soldering method according to the invention.

In the second variant, the method has at least the following steps:

First step (FIG. 11): During the injection of the liquid alloy 48 under pressure into the passages of the guide, the mold 16 is at a temperature below the liquidus threshold of the alloy, but high enough to enable the wetting of the connection-receiving zones 12 and the filling of the passages.

Figure 12:
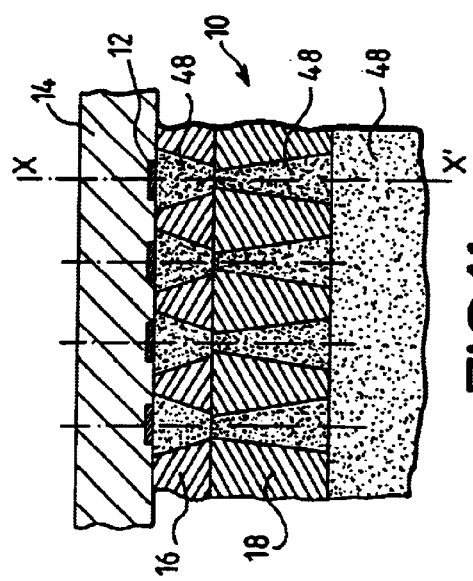

Second step (see FIG. 12); solidification of the alloy in the mold, separation of the mold from the injection matrix: the mold 16 is kept at a temperature below the liquidus threshold of the alloy so that the alloy solidifies rapidly in the first passages 28 of the mold. The injection pressure drops and the liquid alloy 48 withdraws into the injection matrix. The mold is separated from the injection matrix enabling a gas Gz that is a neutral gas or even a reduction gas to saturate the atmosphere beneath the alloy and in the passages of the injection matrix, so that it is well cleaned for the next cycle.

Figure 13:
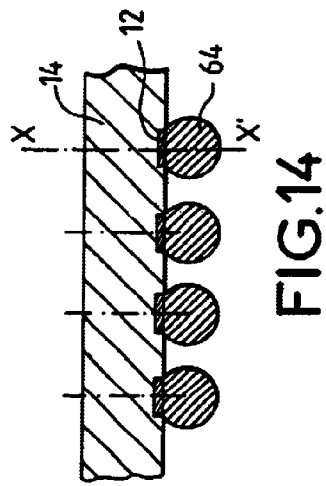

Third step (see FIG. 13); separation of the component (or substrate) from the mold: the lifting of the mold is facilitated because the shape of the first premier passage (or cavity) of the mold is open to the maximum on the substrate side, the mold is made of a material with an expansion coefficient lower than that of the alloy and a chemical deburring type of surface treatment is carried out on the first passage of the mold. The solidified pads 62 have substantially the shape of the first passages 28 in the mold.

Figure 14:
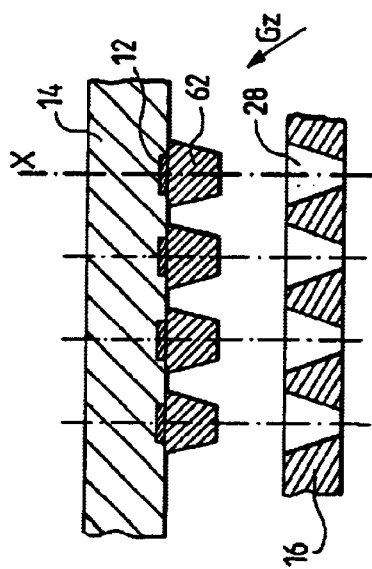

Fourth step (FIG. 14); reflow of the solidified pads 62: this step is necessary to obtain connections in the form of balls 64 that are perfectly positioned with respect to their connection receiving zone 12. This operation can be done in batches in a stove in an environment containing a neutral gas such as nitrogen. Since the alloy undergoes no mechanical stress whatsoever, it takes a regular spherical shape corresponding to the configuration of minimum surface tension. This reflow operation requires no flux, or else a flux with low activity, and it is not necessary to clean the substrate after the reflow operation.

These methods according to the invention have the advantage of using solid tin in the form of rods at a cost that is far smaller than the cost of the solder paste or balls used in the prior art methods. Moreover, the problem of storage is far smaller.

In the first and second variants of the method for making solder connection pads, it is possible to improve the break of the solder between the two parts of the guide at the time of their separation. To this end, the guide is made to vibrate at the time of the separation of the parts, so that this break takes place always at the same place at the level of the narrowing of the guide. This provides for high reproducibility of the volume of the solder connection pads.

Another advantage of the method according to the invention lies in the fact that it enables the shaping and soldering of the connection to the connection-receiving zone in a single step, possibly with a reflow operation in a stove, whereas the other principles of the prior art require, in addition, the use of a silk-screen printing machine and/or ball placing machine, a through furnace or even a cleaning machine. The cost of making the associated machine will, in principle, be twice as small. Finally, the tools associated with each product will be far less costly.

What is claimed is:

1. A method for making balls or solder connection pads directly on an electrically conductive connection-receiving zone of an electric component, the method comprising an operation for the injection of conductive liquid alloy into a guide open at one end placed so as to face the connection-receiving zone of the component, wherein the guide is formed by two separable parts, a mold and an injection matrix, the mold and the injection matrix comprising passages, with a narrowing of the guide at the level of the separation of the parts, and the parts of the guide are separated while the alloy is in the liquid state.

2. A method according to claim 1, wherein the mold is removed from the component before the solidification of the alloy, the molten metal present on the connection-receiving zone of the component taking the shape of a ball when it cools down.

3. A method according to claim 1, wherein the mold is cooled below the liquidus point of the alloy so that the alloy gets solidified in the mold after the separation of the parts, the mold is separated from the component and, optionally, the alloy is remelted so that it takes the form of a ball.

4. A method according to claim 2, comprising the following steps:

the positioning the component on the mold and the holding of the component by pressure on the mold, then the injecting of liquid alloy under pressure into the guide, the rapid filling of the first passages of the mold and the wetting of the connection-receiving zones of the component, the mold being at a temperature below that of the injection matrix but higher than the liquidus threshold of the alloy;

the withdrawal of the liquid alloy into the injection matrix followed by the separation of the mold from the injection matrix, the liquid alloy filling the first passages of the mold that remain in the mold, the mold being colder than the injection matrix and the connection-receiving zone which has been wet by the alloy having a greater surface area than the hole of the mold on the injection matrix side;

the separation of the component of the mold before the alloy solidifies, the alloy having wet a sufficient surface area of the connection-receiving zone so that the liquid alloy remains clinging to the component and not to the mold;

the cooling of the alloy producing its solidification in the form of a sphere.

5. A method according to claim 4, wherein the withdrawal of the alloy from the injection matrix is obtained by a reversal of the pressure of injection of the liquid alloy into the guide.

6. A method according to claim 4, wherein the withdrawal of the alloy from the injection matrix is obtained by a drop in the pressure of injection of the liquid alloy into the guide.

7. A method for making solder pads on a substrate according to claim 3, comprising the following steps:

the positioning of the component on the mold and the holding of the component by pressure on the mold, then the injecting of liquid alloy under pressure into the guide, the rapid filling of the first passages of the mold and the wetting of the connection-receiving zones of the component, the mold being at a temperature below the liquidus threshold of the alloy but high enough to enable the wetting of the connection-receiving zones and the filling of the passages;

the holding of the mold at a temperature below the liquidus threshold of the alloy so that it solidifies rapidly in the first passages of the mold;

the withdrawal of the liquid alloy into the injection matrix followed by the separation of the mold from the injection matrix;

the separation of the component from the mold revealing solder pads soldered to the connection-receiving zones, having the shape of the first passages of the mold.

8. A method according to claim 7, wherein the withdrawal of the alloy from the injection matrix is obtained by a drop in the pressure of injection of the liquid alloy into the guide.

9. A method according to claim 7, wherein a reflow of the solder pads is carried out, making it possible to obtain connections in the forme of balls that are perfectly positioned with respect to the connection-receiving zone.

10. A method according to claim 9, wherein the reflow of the pads is done in batches in a stove with a neutral environment of the nitrogen type.

11. A method according to claim 1, wherein the guide is made to vibrate at the time of the separation of the parts, so that the break of the solder between the two parts of the guide takes place at the same place at the level of the narrowing or the guide, thus providing for very high reproducibility of the volume of the solder connection pads.

12. A method according to claim 4, wherein an inert gas enables the saturation of the atmosphere beneath the alloy and in the second passages of the injection matrix.

13. A guide for the making of balls or solder connection pads directly on electrically conductive connection-receiving zones of an electric component, the guide being designed to contain a conductive liquid alloy and being open at one end, wherein the guide is formed by two separable parts comprising passages with a narrowing of the guide at the level of the separation of the parts, and wherein the parts are designed to ensure a break of the solder between the two parts of the guide when the two parts are separated while the alloy is in a liquid state.

14. A guide according to claim 13, wherein the two parts are separable in the direction of injection of the liquid alloy in the guide.

15. A guide according to claim 13, comprising a mold 16 and an injection matrix 18, each having two main parallel faces, one substrate face, one internal mold face for the mold, and an internal face and an external face for the injection matrix, the mold and the injection matrix respectively comprising first passages in the mold and seconds passages in the injection matrix, each of the first passages being aligned coaxially along an axis XX' with one of the respective second passages facing it, the axis XX' being substantially perpendicular to the main faces of the guide.

16. A guide according to claim 15, wherein the first and second passages have a truncated cone shape, the small diameters of the truncated passages facing each other at the level of the separations of the two parts of the guide so that when these faces are in contact, the passage in the guide comprises a narrowing or a sudden flexure in the diameter of the guide at the level of the separation of the parts.

17. A guide according to claim 16, wherein the apertures with the smallest diameter of the first and second truncated passages respectively on the laces of the mold and the injection matrix in contact have the same diameter.

18. A guide according to claim 16, wherein the aperture of the first passage of the mold facing the injection matrix has a diameter greater than the diameter of the aperture of the second passage of the injection matrix facing the mold.

19. Guide according to claim 16, wherein the aperture of the first passage of the mold facing the injection matrix has a diameter greater than the aperture of the second passage of the injection matrix facing the mold, a shoulder of the aperture on the internal face side of the second passage of the injection matrix penetrating, when the mold and the injection matrix are in contact, into the first truncated passage of the mold.

20. A guide according to claim 15, wherein the first passage of the mold is semi-spherical, the biggest aperture being located on the substrate face of the mold and a small aperture being located on the internal face of the mold, the second passage having a truncated cone shape, its smallest aperture being on the internal face of the injection matrix facing the small semi-spherical aperture of the first passage.

21. A guide according to claim 15, wherein the first passage in the mold is truncated, the smallest diameter of the first passage facing the injection matrix and the second passage in said injection matrix having a cylindrical shape with a diameter that is very small as compared with the smallest diameter of the first passage in the mold.

22. A guide according to claim 15, wherein the mold is made out of a material chosen from among stainless steel 316L with chemical deburring, or graphite, or Teflon, or silicon.

23. A guide according to claim 16, wherein the mold is made out of a material chosen from among stainless steel 316L with chemical deburring, or graphite, or Teflon, or silicon.

24. A guide according to claim 17, wherein the mold is made out of a material chosen from among stainless steel 316L with chemical deburring, or graphite, or Teflon, or silicon.

25. A guide according to claim 18, wherein the mold is made out of a material chosen from among stainless steel 316L with chemical deburring, or graphite, or Teflon, or silicon.

26. A guide according to claim 19, wherein the mold is made out of a material chosen from among stainless steel 316L with chemical deburring, or graphite, or Teflon, or silicon.

27. A guide according to claim 20, wherein the mold is made out of a material chosen from among stainless steel 316L with chemical deburring, or graphite, or Teflon, or silicon.

28. A guide according to claim 21, wherein the mold is made out of a material chosen from among stainless steel 316L with chemical deburring, or graphite, or Teflon, or silicon.

* * * * *